(12) United States Patent
Kron et al.

(10) Patent No.: US 8,079,305 B2
(45) Date of Patent: Dec. 20, 2011

(54) STAMP FOR SOFT LITHOGRAPHY, IN PARTICULAR MICRO CONTACT PRINTING AND A METHOD OF PREPARING THE SAME

(75) Inventors: Gregor Kron, Stuttgart (DE); Jurina Wessels, Stuttgart (DE); Akio Yasuda, Esslingen (DE)

(73) Assignee: Sony Deutschland GmbH, Cologne (DE)

( * ) Notice: Subject to any disclaimer, the term of this patent is extended or adjusted under 35 U.S.C. 154(b) by 490 days.

(21) Appl. No.: 11/269,116

(22) Filed: Nov. 8, 2005

(65) Prior Publication Data

US 2006/0137554 A1 Jun. 29, 2006

(30) Foreign Application Priority Data

Nov. 10, 2004 (EP) .................... 04026681

(51) Int. Cl.
*B41N 1/12* (2006.01)
(52) U.S. Cl. ...................................... 101/368
(58) Field of Classification Search .................. None
See application file for complete search history.

(56) References Cited

U.S. PATENT DOCUMENTS

2004/0067801 A1* 4/2004 Nesbitt et al. ............... 473/372
2005/0238967 A1* 10/2005 Rogers et al. ................ 430/5

FOREIGN PATENT DOCUMENTS

| EP | 1 193 056 | 4/2002 |
| JP | 5-265365 | 10/1993 |
| WO | WO 03/035932 | 5/2003 |

OTHER PUBLICATIONS

Van Alsten, John G. Macromolecules 1996, 29, 2163-2168.*
Schmid, H.; Michel, B.; Macromolecules 33 (Mar. 2000), 3042-3049.*
Odom, T. W. et al.; Langmuir 18 (May 2002), 5314-5320.*
Journal of the American Chemical Society, J.A. Rogers et. al., No. 125, 2003, pp. 4060-4061, XP002323413.
Langmuir, G.M. Whitesides et. al., No. 18, 2002, pp. 5314-5320, XP002323414.
Langmuir, G. Csucs et. al., No. 19, 2003, pp. 6104-6109, XP002323415.
Langmuir, D. Trimbach et. al., No. 19, 2003, pp. 10957-10961, XP002323416.
Office Action mailed May 24, 2011, in Japan Patent Application No. 2005-326562, filed Nov. 10, 2005.

* cited by examiner

*Primary Examiner* — Joshua D. Zimmerman
(74) *Attorney, Agent, or Firm* — Oblon, Spivak, McClelland, Maier & Neustadt, L.L.P.

(57) ABSTRACT

The present invention relates to a stamp for soft lithography. It also relates to a method of preparing a stamp for soft lithography, in particular micro contact printing, and to uses of such stamp.

21 Claims, 6 Drawing Sheets

Fig. 1

Fig. 2 a and b: SEM picture of a Surlyn™ stamp surface with 75nm smallest bar width.

STAMP FOR SOFT LITHOGRAPHY, IN PARTICULAR MICRO CONTACT PRINTING AND A METHOD OF PREPARING THE SAME

The present invention relates to a stamp for soft lithography. It also relates to a method of preparing a stamp for soft lithography, in particular micro contact printing, and to uses of such stamp.

From the many micro fabrication techniques available, soft lithography has become a method of first choice in many laboratories for defining chemically micro- and nanostructured surfaces (Xia, Y; Whitesides, G. M.; Annu. Rev. Mater. Sci. 28 (1998), 153-184; Michel, B. et al.; IBM J. Res. & Dev. 45 (2001), 697-719). All different techniques summarised under the term "soft lithography" share the common feature of using a patterned elastomer as the stamp, mould or mask to generate micro- and nanopatterns and -structures. These various members include microcontact printing (μCP), replica moulding, micro transfer moulding, micro moulding in capillaries, solvent-assisted micro moulding, phase-shift photolithography, cast moulding, embossing and injection moulding. A review of various soft lithography techniques can be found in Xia et al., 1998, Annu. Rev. Mater Sci., 28:153-184. Among these soft lithography techniques, the technique of microcontact printing has become the most commonly used method (Xia et al., ibid). Here, an "ink" of molecules is spread on a patterned polymer stamp surface. Subsequently the stamp is brought into contact with a substrate. At this point, the molecules are transferred to the surface of the substrate where they ideally form self assembled mono layers (Delamarche, E. et al.; J. Phys. Chem. B 102 (1998), 3324-3334; Delamarche, E. et al.; J. Am. Chem. Soc. 124 (2002), 3834-3835). Microcontact printing commonly uses stamps of for example poly(dimethylsiloxane) (commercially available for example as Sylgard 184 PDMS). However, this polymer having a Young's modulus of 3 MPa proved to be too soft to define feature sizes below 500 nm (Michel, B. et al.; IBM J. Res. & Dev. 45 (2001), 697-719).

Stamp materials in soft lithography are subjected to self-adhesion and mechanical stresses during printing. These stresses during printing can cause the material to deform (Schmid, H.; Michel, B.; Macromolecules 33 (2000), 3042-3049) or to collapse (Delamarche, E. et al.; Adv. Mater. 9 (1997), 741-746). In order to avoid the problems of deformation and collapsing due to the material properties of the soft Sylgard 184, new polymeric materials have been tested for their suitability for μCP purposes. The most promising approach is a composite polymeric stamp consisting of a thick flexible PDMS 184 slab and a thin and hard PDMS layer with the designed structure (Schmid, H.; Michel, B.; Macromolecules 33 (2000), 3042-3049; Odom, T. W. et al.; Langmuir 18 (2002), 5314-5320). The hard PDMS consists of a mixture of vinyl PDMS prepolymer, a platinum divinyltetramethyl-disiloxane catalyst, a tetramethyl tetravinyl cyclotetrasiloxane modulator and a hydrosilane prepolymer. The resulting polymer has a Young's modulus of 9.7 MPa. Structures with feature sizes of 50 nm were achieved using the composite stamps (Odom, T. W. et al.; J. Am. Chem. Soc. 124 (2002), 12112-12113).

There are different attempts using non-PDMS materials with high Young's modulus like block copolymer thermoplastic elastomers (Trimbach, D. et al.; Langmuir 19 (2003), 10957-10961) and polyolefin plastomers (Csucs, G. et al.; Langmuir 19 (2003), 6104-6109). In the first case, structures down to 1 μm could be realized. Using the polyolefin plastomers, structure sizes down to 100 nm were achieved.

The material commonly used in micro contact printing so far are either too soft for creating reliable prints below a feature size <200 nm, or the stamps, especially the more highly resolving composite polymeric stamps are difficult to fabricate.

Accordingly, it was an object of the present invention to provide for a method of preparing a stamp which is easy to perform and which allows the fabrication of stamps at least as good in terms of resolution as the ones from the prior art. Furthermore it was an object of the present invention to provide for a stamp allowing micro contact printing with a resolution <500 nm, which stamp is easy to fabricate and therefore cheap in manufacture.

All these objects are solved by a stamp for soft lithography, in particular for micro contact printing, characterized in that it is made of an ionomeric polymer.

In one embodiment, said ionomeric polymer is poly(ethylene-co-methacrylic acid), wherein, preferably, said poly(ethylene-co-methacrylic acid) is a polymer wherein ethylene has been randomly copolymerized with methacrylic acid at a ratio of 10:1 to 100:1, preferably >10.

Preferably, said poly(ethylene-co-methacrylic acid) has a mean molecular weight in the range of from 50,000 to 200,000, preferably 100,000-150,000.

More preferably, said poly(ethylene-co-methacrylic acid) some or all of the methacrylic acid carboxol groups are in the form of zinc carboxylate or sodium carboxylate.

In one embodiment, said stamp has a Young's modulus >20 MPa.

Preferably, said stamp further comprises a cured silicone-based material, wherein, preferably, it comprises a first part for printing, said first part being made of said ionomeric polymer, and a second part for providing conformal contact of the stamp with a substrate surface to be printed on, said second part be made of said cured silicone-based material.

In one embodiment, said cured silicone-based material is a polydimethylsiloxane polymer, preferably a vinyl-polydimethylsiloxane polymer.

Preferably, said first part has a front face for printing and a back face opposite said front face, and said second part is arranged on said back face of said first part such that said first part is at least partially embedded in said second part, wherein, more preferably, said second part provides a margin extending beyond said first part, preferably all around said first part, said margin allowing for conformal contact with a surface to be printed on.

In a preferred embodiment, said front face has a structured surface for printing.

The objects of the present invention are also solved by a method of preparing a stamp for soft lithography, in particular for microcontact printing, comprising the steps:
  (a) providing a master having a surface and a relief structure on said surface,
  (b) providing a polymeric foil,
  (c) pressing said master into said polymeric foil thus leaving an imprint of said relief structure on said polymeric foil,
  (d) releasing said master from said imprinted polymeric foil, said polymeric foil being made of an ionomeric polymer, preferably poly(ethylene-co-methacrylic acid).

In a preferred embodiment step d) occurs in the presence of a release agent, e.g. a fluorinated silane.

In a preferred embodiment, step c) occurs for a time in the range of from 1 min to 120 min, preferably 10 min to 60 min, more preferably 30 min to 60 min, and most preferably >40 min.

In one embodiment, step c) occurs with a pressure in the range of from 100 kPa to 250 kPa, preferably 150 kPa to 200 kPa.

Preferebly, step c) occurs at an elevated temperature in the range of from 80° C. to 150° C., preferably 100° C. to 135° C., more preferably 120° C. to 130° C., most preferably around 125° C.

In one embodiment, said master or said polymeric foil or both are kept at said elevated temperature during step c).

In a preferred embodiment, step d) occurs after cooling down to room temperature.

Preferably, said polymeric foil has a thickness in the range of from 50 µm to 500 µm, preferably 75 µm to 300 µm, more preferably 100 µm to 200 µm, most preferably around 150 µm.

In one embodiment, said poly(ethylene-co-methacrylic acid) is a polymer wherein ethylene has been randomly copolymerised with methacrylic acid at a ratio of 10:1 to 100:1, preferably >10.

Preferably, said poly(ethylene-co-methacrylic acid) has a mean molecular weight in the range of from 50000 to 200000, preferably 100000-150000.

More preferably, in said poly(ethylene-co-methacrylic acid) some or all of the methacrylic acid carboxyl groups are in the form of zinc carboxylate or sodium carboxylate.

In one embodiment, said foil is made of a material capable of achieving a Young's modulus >20 MPa after heating.

In one embodiment, said imprinted polymeric foil has a front face for printing and a back face opposite said front face, and after step d) a curable silicone-based material is placed on said back face of said imprinted polymeric foil and subsequently cured, said imprinted polymeric foil thus being at least partially embedded in said cured silicone-based material, wherein preferably, said front face has a structured surface for printing.

In one embodiment, said curable silicone-based material is a polydimethylsiloxane prepolymer, preferably a vinyl-polydimethylsiloxane prepolymer and is cured in the presence of a catalyst, preferably a platinum catalyst, and of copolymers of methylhydrosiloxane and dimethylsiloxane.

Preferably, after step d) a surface, preferably said front face of said imprinted polymeric foil is further modified, wherein, preferably, said surface is further modified by a process selected from plasma treatment, chemical modification and treatment with a surfactant.

It should be noted that such surface modification has the purpose of lowering ink adhesion to the surface for an easy transfer process.

The objects of the present invention are also solved by a stamp produced by the method according to the present invention.

The objects of the present invention are also solved by the use of a stamp according to the present invention for soft lithography, in particular microcontact printing, wherein, preferably, said stamp is inked by contact inking or wet inking.

Preferably, said use is for microcontact printing of conducting leads or paths, preferably of grid-structures or cross-bar structures. In particular said use is for microcontact printing of conducting leads or paths, preferably of conducting leads or paths which cross each other and/or intersect with each other (crossing conducting leads/paths or intersecting conducting leads/paths).

Preferably, said grid-structures and/or said cross-bar structures are structures made of conducting leads, more preferably having a width in the range of from 10 nm to 200 nm. In one embodiment, said grid-structures and/or said cross-bar structures comprise pads, preferably having an edge length of about 100 µm.

Such conducting paths or leads may, for example, be realised by printing a structure using an inorganic ink, e.g. a metal, with line widths in the range of from 10 nm to 100 µm, preferably 10 nm to 200 nm. In another embodiment, also pads may be printed having an edge length of about 100 µm.

As used herein, the term "cross-bar-structures" is meant to signify any structure wherein printed features, like lines, cross each other.

The objects of the present invention are also solved by a method of microcontact printing, comprising the steps:
e) providing a stamp according to the present invention,
f) inking said stamp, preferably by contact inking or wet inking,
g) pressing said inked stamp on a substrate.

The objects of the present invention are also solved by the use of an ionomeric polymeric material, as defined above, for soft lithography, in particular microcontact printing.

The inventors have surprisingly found that an ionomeric polymer, in particular poly-(ethylene-co-methacrylic acid) allows for the fabrication of stamps particularly suited for micro contact printing. More specifically, a combination of the technique of hot embossing and the use of a polymeric ionomeric foil allows for the production of high quality stamps to be used in micro contact printing. The stamps thus produced can achieve a high aspect ratio, e.g. >2.0. In particular, it has been found out that an ionomeric polymeric foil appears to be particularly useful for that purpose. The stamps are cheap and easy to manufacture. Without wishing to be, bound by any theory it is believed that in an ionomeric polymer, the polymer structure has three regions, namely amorphous polymer, crystalline polymer and ionic clusters. It appears as if these features are responsible for the superior abrasion resistance, thermoplasticity and the higher hardness. One example that appears to be particularly useful for that purpose is a poly(ethylene-co-methacrylic) copolymer, e.g. commercially available from DuPont as Surlyn®. Surlyn® is a commercial thermoplastic ionomeric resin that was introduced by DuPont in the early nineteen sixties. Its commercial applications are within the packaging industry. Some of the properties that make Surlyn® excellent for such packaging applications are its sealing performance, formability, clarity, oil/grease resistance and high hot draw strength. Good hot draw strength allows for a faster packaging line speed and reduces packaging failures. Another well known application of Surlyn® is its use in the outer covering of golf balls. To the best of the inventors' knowledge, Surlyn®, or other ionomeric polymers have not been used for the fabrication of stamps for micro contact printing. In Surlyn® some of carboxyl groups of the methacrylic acid part are in the form of zinc carboxylate and/or sodium carboxylate.

The combination of a polymeric ionomeric foil with hot embossing technique is simple and thus amenable to processing on an industrial scale, for example in roll-to-roll-manufacturing processes.

Fabrication of a master to be used for imprinting on the polymeric foil according to the present invention is a process known to someone skilled in the art and has for example been described in xia et al., ibid. For example, the master may be fabricated using micro lithographic techniques such as photo lithography, micro machining, electron-beam-writing or from available relief structures such as diffraction gratings, TEM grids, polymer beads assembled on solid supports and relief structures etched in metals or Si.

The process of micro contact printing itself has in detail been described in Xia et al., ibid. and Michel et al. ibid. and is therefore well known to someone skilled in the art.

Using the method and the stamp according to the present invention, a cheap way of producing micro contact printing stamps is provided by which structures of a resolution <100 nm can easily be realised.

Furthermore, the inventors have surprisingly found that the invention allows for the fabrication of composite stamps comprising a first part for the actual printing process, and a second part into which the first part for printing is at least partially embedded, which second part allows for a conformal contact of the stamp with a substrate surface to be printed on.

According to the invention, the first part is made of the ionomeric polymer, whereas the second part is made of a soft polymer, preferably a polydimethylsiloxane polymer which provides for a strong adhesion of the stamp according to the present invention to a substrate surface to be printed on. The second part or "soft polymer" part is arranged on the back of the first part (or "ionomeric polymer part"), and preferably extends over the edges of said first part, thus providing a margin all around the first part. As used herein, the term "the first part is at least partially embedded in said second part" is meant to mean that the back face of said first part is covered by said second part, whereas the front face of said first part is fully accessible and can be used for the actual printing progress.

As used herein, the term "ionomeric polymer" is meant to signify a copolymer having a proportion of hydrophobic monomers and another proportion of comonomers, which comonomers carry ionic groups. These ionic groups may be present in the main chain (back bone) of the polymer but also in side chains of the polymer. Preferably, the proportion of hydrophobic monomers is larger than the proportion of the comonomers carrying the ionic groups. In a preferred embodiment, the proportion of comonomers carrying ionic groups may be as high as 15%.

In the following reference is made to the figures wherein

FIG. 3 shows a thiol structure transferred by a Surlyn® stamp according to the present invention under finger pressure to an Au surface (a) and FIG. 3*b* shows another transferred thiol test structure.

In the following reference is made to the examples which are given to illustrate, not to limit the invention.

EXAMPLE 1

Master Replication

Figure 1:
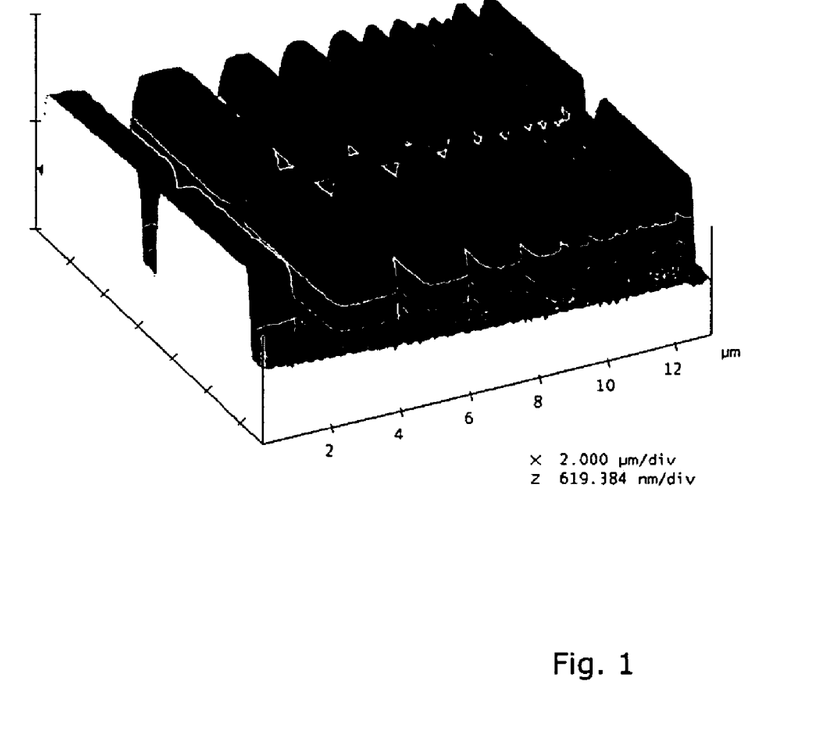
FIG. 1 shows a conventional stamp according to the prior art using Sylgard™ 184 PDMS, having bar structures ranging from a bar width of 200 nm to 2 μm.
Figure 2:
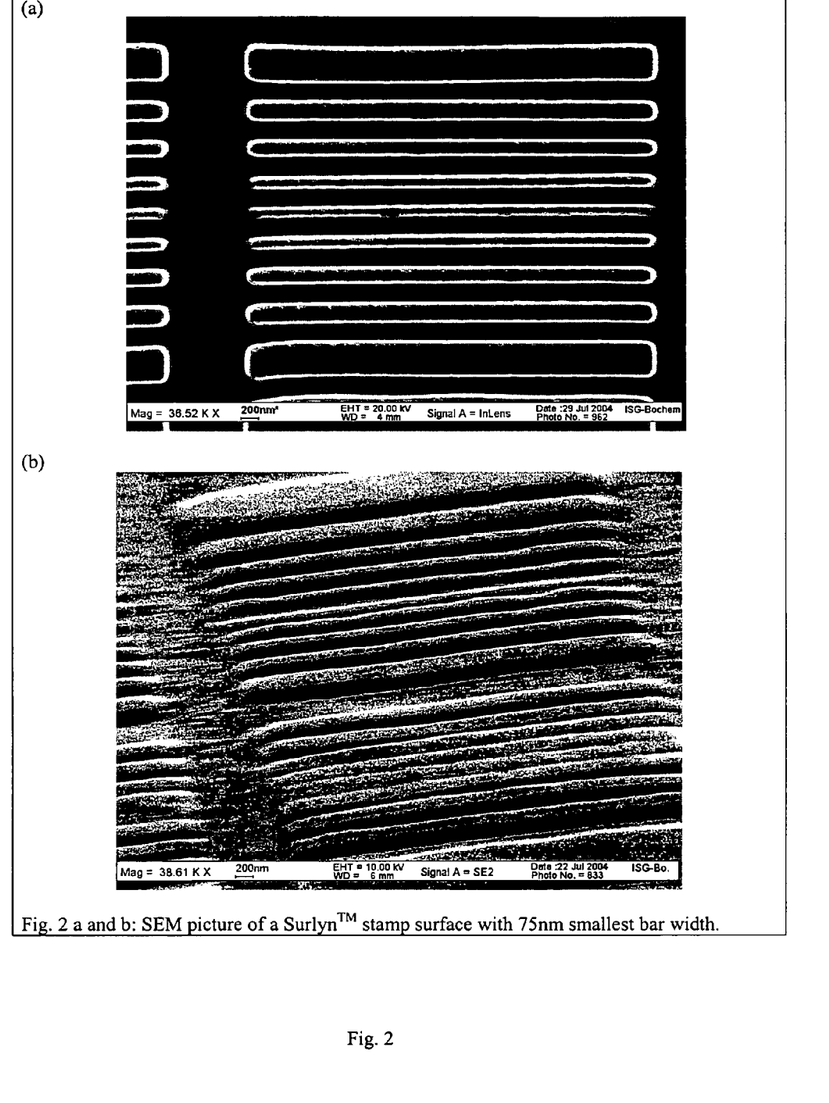
FIG. 2 shows an optical microscope picture of a patterned Surlyn™ stamp surface (a), and a picture of the same surface taken with the scanning electron microscope (b)

Surlyn® is a hard polymer with a Young's modulus above 20 MPa. This polymer is used as one example of a polymer useful for the present invention. The replication of structures into this material is realized with hot embossing technique using a thin Surlyn® foil with a thickness of ≈150 μm. For the fabrication of stamps, a $SiO_2$ master (fabricated by e-beam lithography and subsequent RIE etching) and the Surlyn® foil are placed between two SDS (sodium dodecyl sulfate) covered glass plates and the master is pressed at a temperature of 125° C. into the foil. Processs times around 10 min appeared to be reasonable for an almost complete pattern replication. However, an increase to 40 min results in a significant replication improvement. After cooling down to room temperature and separation of the stamp from the master, a complete pattern transfer with the same height as the master pattern can be obeserved. At 120° C. Surlyn® partly forms a network resulting in an increase in hardness. The Young's modulus was measured to be above 20 MPa. FIG. 2 *a*) and *b*) show an optical microscope and a SEM picture of the smooth and almost defect free stamp surface.

EXAMPLE 2

Printing with Stamps Made of Ionomeric Resins, e.g. Surlyn® a) Printing of Molecules

Figure 3:
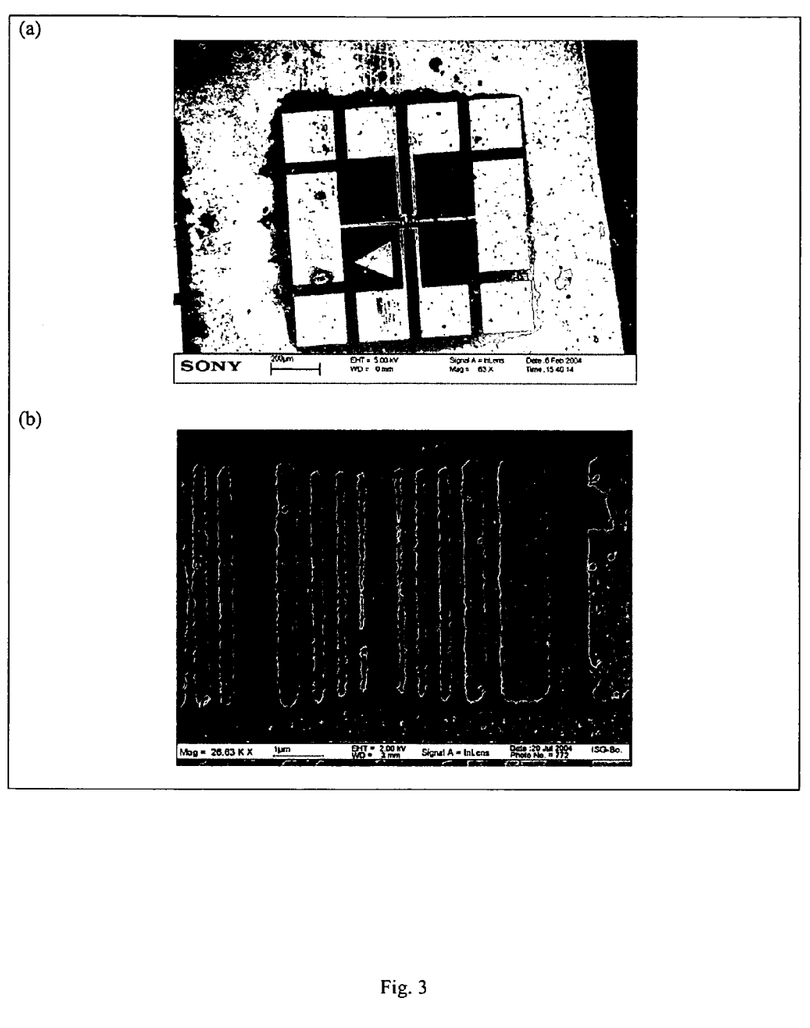

Using Surlyn® as an example, ionomeric resins prove to be suitable materials for μCP. Printing experiments have been made using octadecanethiols as material to be transferred. The stamp has been inked using the method of contact and wet inking. For contact inking, the stamp is placed for 2 minutes on a piece of PDMS which was exposed to a $10^{-3}$ M thiol solution (in ethanol) over night and dried afterwards. Alternatively, in case of wet inking, the stamp is covered by a small amount of the molecule solution ($10^{-3}$ M) which is dropped directly on the stamp and dried after 30 s with a stream of nitrogen. Subsequently, the stamp is brought into contact with an Au substrate. Finger pressure was applied for 5 minutes in order to obtain conformal contact between the stamp and the substrate. FIG. 3 *a*) and *b*) shows SEM images of the transferred pattern using a stamp that was inked with the contact inking method and pressed with the finger against the Au substrate. The structured area was completely transferred. In addition, unspecific transfer of molecules due to a certain sagging effect can be observed, i.e. unwanted areas of the stamp surface were also in contact with the substrate. Up to the moment, printing of smaller structures down to 100 nm have been successfully realized using Surlyn® with its high Young's modulus as stamp material (FIG. 3*b*).

b) Printing of Gold

Printing of Au electrodes on top of modified substrate surfaces is a further requirement Surlyn® proved to be suitable for.

i) Printing Au on Au Substrate

Figure 4:
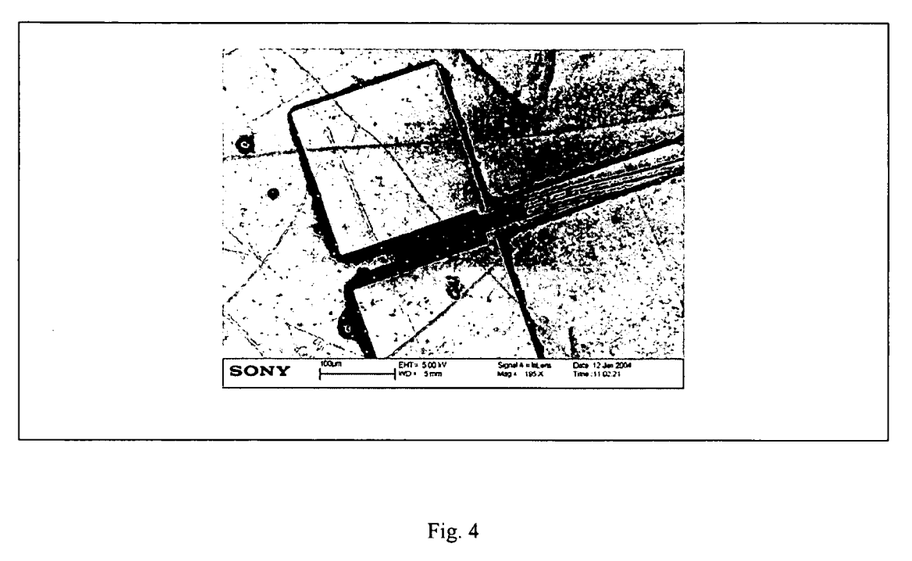
FIG. 4 shows an approximately 20 m thick Au electrode structure printed with a stamp according to the present invention.

Approximately 20 nm of Au were freshly thermally evaporated onto an unmodified Surlyn stamp surface. The stamp was subsequently pressed for 15 hours on a nonanedithiol covered Au substrate. The thiol group serves as anchor point for the printed electrodes (one thiol group binds to the Au substrate while the second thiol group binds to the Au top-electrode). After the stamp was removed, a clear Au transfer to the molecule covered Au surface could be observed (FIG. 4). According to the SEM image of the stamped electrodes (FIG. 4), the Au layer is not uniform, i.e. the structure consists of a high amount of Au islands. Compared to the Au structures printed with Surlyn (contact angle ≈95°), the Au structures stamped with PDMS (contact angle ≈105°) appear flat and uniform without island formation.

Up to the moment it is unclear whether this island formation happens on the stamp surface before the transfer or during the transfer on the substrate. However, it is expected that a uniform Au electrode structure can be achieved by simply using either thicker (≈50 nm) Au layers on the stamp or by modifying the Surlyn surface. After e.g. plasma treatment, Surlyn contains surface OH groups that can be used for the attachment of molecules with terminal groups that can alter the hydrophilicity of the surface. More hydrophyilic surfaces lead to continous and smooth Au films on the polymer surface.

ii) Printing Au on SiO$_2$ Substrate

As a modification, printing of Au is also possible on SiO$_2$ surfaces functionalized with Aminosilanes or Mercaptosilanes, i.e. Trimethoxysilylpropylethylendiamrin or Mercaptopropyltriethoxysilan, respectively.

In this case, the Si atom of the silane binds via an O-bridge to the substrate surface while the Amino- or the mercapto group serves as anchor point to the printed Au electrode. Prerquisite for this process is that the SiO$_2$ surface is homogenously covered with the required functional group.

iii) Lubricant for Transfer of Au

Critical for the successful transfer of Au onto SiO$_2$ surfaces are the interaction forces at the interfaces between stamp/Au and Au/modified SiO$_2$ surface. Strong adhesion between Au and the Surlyn stamp inhibits the Au transfer. A lubricant film between the Au layer and the Surlyn surface can reduce the adhesion force and therefore provide a complete and unproblematic transfer process. Fluorosilanes could serve as lubricants since they bind via carboxyl groups to the polymer surface which carboxyl groups are located at the polymer surface. The F-atom minimizes because of its high hydrophobicity the adhesion of the Au film to the stamp. Before evaporation of Au on the stamp, its surface has to be modified with the appropriate fluorosilane. The fluorosilanisation process can be done in either vacuum via the gas phase or in solution. In both cases an activation of the stamp surface with OH groups is necessary in order to provide anchor point for the molecules on the Polymer surface.

EXAMPLE 3

Composite Stamps

Another critical parameter for the pattern transfer is the contact between the stamps and the surface. Conventionally, the stamp is pressed onto the surface in order to achieve conformal contact between the stamp and the substrate. Composite stamps have been proposed and described in the past for two different kinds of PDMS. They consist of a thick flexible PDMS 184 slab and a thin and hard PDMS layer with the designed structure (Schmid, H.; Michel, B.; Macromolecules 33 (2000), 3042-3049; Odom, T. W. et al.; Langmuir 18 (2002), 5314-5320). The hard PDMS contains of a mixture of vinyl PDMS prepolymer, a platinumdivinyltetramethyldisiloxane catalyst, a tetramethyltetravinylcyclotetrasiloxane modulator and a hydrosilane prepolymer. The resulting polymer has a Young's modulus of 9.7 MPa. Structures with feature sizes of 50 mm were achieved using the composite stamps (Odom, T. W. et al.; J. Am. Chem. Soc. 124 (2002), 12112-12113).

Figure 5:
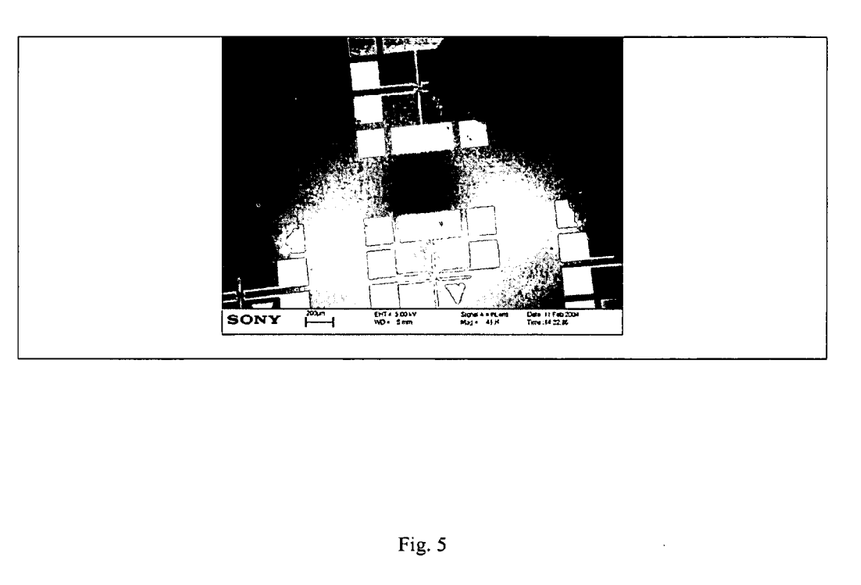
FIG. 5 shows a thiol structure transferred under soft pressure provided by a composite Surlyn®/PDMS stamp according to the present invention.
Figure 6:
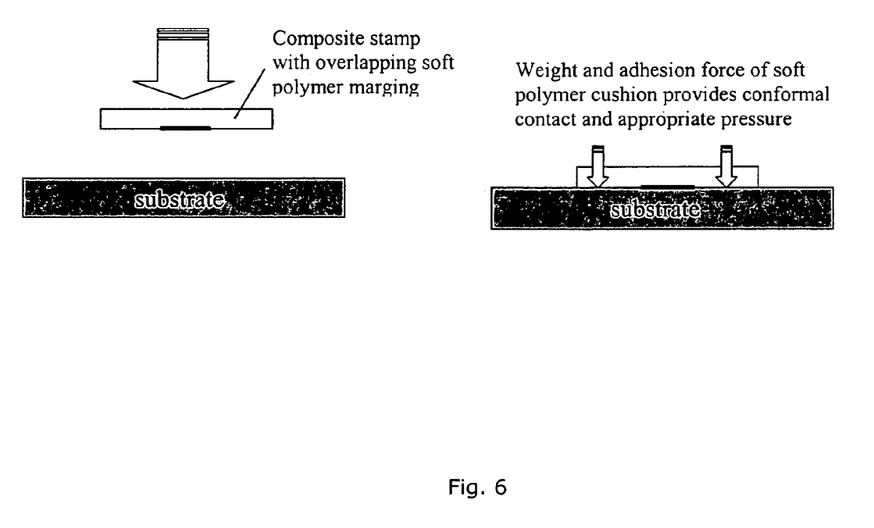
FIG. 6 shows the principle of a composite stamp according to the present invention showing a soft polymer cushion (grey) encompassing a structured hard polymeric foil (black) which is the part actually used for printing.

According to one aspect of the present invention, composite two layer stamps containing ionomeric resins, e.g. Surlyn are envisaged as a possible solution to overcome the problem of the low adhesion force of the ionomeric, e.g. Surlyn material on one side and a sagging effect by applying pressure on the other side, i.e. use of two-layer stamps. These composite stamps consist of a thin (≈150 μm) Surlyn layer containing the actual stamp pattern and a thicker (≈2 mm) second PDMS layer. The PDMS layer is poured as a liquid on top of the Surlyn backside and subsequently cured. This second PDMS layer guarantees a conformal contact of the stamp surface to the substrate surface. By its body weight and its property to suck itself onto the surface, the PDMS layer presses the Surlyn layer softly on the substrate and balances all unevenness of a surface in parallel. In order to amplify this effect, the PDMS layer could be larger than the Surlyn film resulting in a direct contact between PDMS and the substrate material at the Surlyn edges. Since PDMS has the property to suck itself to the surface, the stamp should be pressed softly to conformal contact. The soft pressure due to adhesion of the PDMS avoids the sagging effect (FIG. 5). Thus, composite stamps according to the present invention consist of a thin structured hard polymeric ionomeric foil, e.g. Surlyn™ foil, and a soft polymer cushion (preferably PDMS) with overlapping margin. The advantage of using a soft polymeric material on top of the polymeric foil is to provide a flexible stamp backbone. The weight of the thicker soft polymer back and especially the adhesion force between the margin and the substrate enables conformal contact of the structured polymer foil with the substrate surface and provides the appropriate pressure for the printing process.

The features disclosed in the specification, the claims and/or in the accompanying drawings, may, both separately, and in any combination thereof, be material for realising the invention in various forms thereof.

The invention claimed is:

1. A stamp for soft lithography, comprising:
   a printing part and a contacting part;
   wherein the printing part has a front face for printing and a back face;
   wherein the front face for printing has a structured surface;
   wherein the printing part is embedded in the contacting part, the back face of the printing part is embedded in the contacting part, and the structured surface of the front face for printing is an outermost surface for micro contact printing with a resolution of <500 nm; and
   wherein the structured surface of the front face is made of an ionomeric polymer.

2. The stamp according to claim 1, characterized in that said ionomeric polymer is poly(ethylene-co-methacrylic acid).

3. The stamp according to claim 2, wherein said poly(ethylene-co-methacrylic acid) is a polymer wherein ethylene has been randomly copolymerized with methacrylic acid at a ratio of 10:1 to 100:1.

4. The stamp according to claim 2, wherein said poly(ethylene-co-methacrylic acid) has a mean molecular weight in the range of from 50,000 to 200,000.

5. The stamp according to claim 2, wherein in said poly(ethylene-co-methacrylic acid) some or all of the methacrylic acid carboxyl groups are in the form of zinc carboxylate or sodium carboxylate.

6. The stamp according to claim 1, characterized in that it has a Young's modulus >20 MPa.

7. The stamp according to claim 1, further comprising a cured silicone-based material.

8. The stamp according to claim 7, wherein the contacting part provides conformal contact of the stamp with a substrate surface to be printed on, said contacting part made of said cured silicone-based material.

9. The stamp according to claim 7, wherein said cured silicone-based material is a polydimethylsiloxane polymer.

10. The stamp according to claim 1, wherein said contacting part provides a margin extending beyond said printing part, said margin allowing for conformal contact with a surface to be printed on.

11. The stamp according to claim 1, which is a microcontact printing stamp.

12. The stamp according to claim 2, wherein said poly(ethylene-co-methacrylic acid) is a polymer wherein ethylene has been randomly copolymerized with methacrylic acid at a ratio of >10.

13. The stamp according to claim 2, wherein said poly(ethylene-co-methacrylic acid) has a mean molecular weight in the range of from 100,000-150,000.

14. The stamp according to claim 7, wherein said cured silicon-based material is a vinyl-polydimethylsiloxane polymer.

15. The stamp according to claim 1, having contact structures on the contact layer having dimensions of from 10 to 200 nm.

16. The stamp according to claim 10, wherein said margin extends all around the printing part.

17. The stamp according to claim 1, wherein the ionomeric polymer is a thermoplastic polymer.

18. The stamp according to claim 1, wherein the ionomeric polymer comprises at least one group selected from the group consisting a zinc carboxylate group and a sodium carboxylate group.

19. The stamp according to claim 1, wherein the ionomeric polymer is uncured.

20. The stamp according to claim 1, wherein the structured surface is formed on the ionomeric polymer by hot embossing.

21. A method of microcontact printing, comprising the steps:
  e) providing a stamp according to claim 1,
  f) inking said stamp, preferably by contact inking or wet inking,
  g) pressing said inked stamp on a substrate.

* * * * *